(12) United States Patent (10) Patent No.: US 9,654,074 B2
Lin (45) Date of Patent: May 16, 2017

(54) VARIABLE GAIN AMPLIFIER CIRCUIT, CONTROLLER OF MAIN AMPLIFIER AND ASSOCIATED CONTROL METHOD

(71) Applicant: MEDIATEK INC., Hsin-Chu (TW)

(72) Inventor: Lai-Ching Lin, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/919,737

(22) Filed: Oct. 22, 2015

(65) Prior Publication Data

US 2016/0352298 A1 Dec. 1, 2016

Related U.S. Application Data

(60) Provisional application No. 62/168,892, filed on May 31, 2015.

(51) Int. Cl.
*H03G 3/30* (2006.01)
*H03F 1/02* (2006.01)
(Continued)

(52) U.S. Cl.
CPC ............ *H03G 3/30* (2013.01); *H03F 1/0205* (2013.01); *H03F 1/0277* (2013.01); *H03F 1/223* (2013.01); *H03F 1/301* (2013.01); *H03F 3/211* (2013.01); *H03F 3/45179* (2013.01); *H03F 2200/462* (2013.01); *H03F 2200/78* (2013.01); *H03F 2203/45114* (2013.01); *H03F 2203/45116* (2013.01)

(58) Field of Classification Search
CPC .................................... H03G 3/20; H03G 3/30
USPC .................... 330/86, 140, 282, 285
See application file for complete search history.

(56) References Cited

U.S. PATENT DOCUMENTS 3,428,909 A * 2/1969 Rubin ................. H03F 3/26
330/139
7,109,897 B1 9/2006 Levesque
(Continued)

FOREIGN PATENT DOCUMENTS

EP 1 693 958 A1 8/2006

OTHER PUBLICATIONS

Lepkowski, Jim; "Zener Macro-Models Provide Accurate SPICE Simulatioons", on Semiconductor, Jan. 2006.*
(Continued)

*Primary Examiner* — Steven J Mottola
(74) *Attorney, Agent, or Firm* — Winston Hsu; Scott Margo

(57) ABSTRACT

A variable gain amplifier circuit comprises a main amplifier, a current sensing circuit, a variable loading and a control amplifier. The main amplifier is configured for amplifying an input signal to generate an output signal. The current sensing circuit is coupled to the main amplifier, and is configured for generating a sensed current related to a current flowing through the main amplifier. The variable loading is coupled to the current mirror via a node, wherein the sensed current flows through the node and the variable loading. The control amplifier is coupled to the node and the main amplifier, and is configured for receiving a control voltage and a voltage of the node to generate an adjustment signal to control a gain of the main amplifier, wherein a resistance of the variable loading has a nonlinear relationship with the control voltage.

22 Claims, 10 Drawing Sheets

(51) Int. Cl.
*H03F 3/45* (2006.01)
*H03F 1/22* (2006.01)
*H03F 1/30* (2006.01)
*H03F 3/21* (2006.01)

(56) References Cited

U.S. PATENT DOCUMENTS

| | | |
|---|---|---|
| 7,741,909 B2 | 6/2010 | Tong et al. |
| 7,876,154 B2 | 1/2011 | Beck |
| 8,098,100 B2 | 1/2012 | Tseng et al. |
| 8,102,209 B2 | 1/2012 | Jang et al. |
| 8,565,699 B1 | 10/2013 | Lipshitz et al. |
| 8,779,854 B2 | 7/2014 | Krosschell |
| 8,779,859 B2 | 7/2014 | Su et al. |
| 2005/0206367 A1* | 9/2005 | Krieger .............. G01R 19/0092 324/115 |
| 2007/0262818 A1 | 11/2007 | Lee |
| 2010/0308916 A1 | 12/2010 | Lee |

OTHER PUBLICATIONS

A Novel CMOS Exponential Approximation Circuit, Ming-Lang Lin, Ahmet T Erdogan, Tughrul Arslan, Adrian Stoica, SOC Conference, 2008 IEEE International.

\* cited by examiner

VARIABLE GAIN AMPLIFIER CIRCUIT, CONTROLLER OF MAIN AMPLIFIER AND ASSOCIATED CONTROL METHOD

CROSS REFERENCE TO RELATED APPLICATIONS

This application claims the priority of U.S. Provisional Application No. 62/168,892, filed on May 31, 2015, which is included herein by reference in its entirety.

BACKGROUND

To satisfy some standards or design requirements, a control amplifier is designed to be a linear-in-dB variable gain amplifier, that is, an output power and a control voltage of the control amplifier may have an exponential relation. However, the designs of the linear-in-dB variable gain amplifier may suffer some problems such as accuracy, process/temperature variations issue, and so forth. Therefore, it is important to provide a novel design to solve the above-mentioned problems.

SUMMARY

It is therefore an objective of the present invention to provide a variable gain amplifier circuit, controller of a main amplifier and associated control method, which may have accurate and predictable output power/voltage, process/temperature-independent characteristics, flexibility for the specification(s), and tunable for amplifier characteristics, to solve the above-mentioned problems.

According to one embodiment of the present invention, a variable gain amplifier circuit comprises a main amplifier, a current sensing circuit, a variable loading and a control amplifier. The main amplifier is configured for amplifying an input signal to generate an output signal. The current sensing circuit is coupled to the main amplifier, and is configured for generating a sensed current related to a current flowing through the main amplifier. The variable loading is coupled to the current sensing circuit via a node, wherein the sensed current flows through the node and the variable loading. The control amplifier is coupled to the node and the main amplifier, and is configured for receiving a control voltage and a voltage of the node to generate an adjustment signal to control a gain of the main amplifier, wherein a resistance of the variable loading has a nonlinear relationship with the control voltage.

According to another embodiment of the present invention, a controller of a main amplifier comprises a current sensing circuit, a variable loading and a control amplifier. The current sensing circuit is configured for generating a sensed current related to a current flowing through the main amplifier. The variable loading is coupled to the current mirror via a node, wherein the sensed current flows through the node and the variable loading. The control amplifier is coupled to the node, and is configured for receiving a control voltage and a loading voltage of the node to generate an adjustment signal to control a gain of the main amplifier; wherein a resistance of the variable loading has a nonlinear relationship with the control voltage.

According to another embodiment of the present invention, a method for controlling a main amplifier comprises: generating a sensed current related to a current flowing through the main amplifier; providing a variable loading for receiving the sensed current at a node, wherein the sensed current flows through the node and the variable loading; and receiving a control voltage and a loading voltage of the node to generating an adjustment signal according to a control voltage and a voltage of the node to control the gain of the main amplifier; wherein a resistance of the variable loading has a nonlinear relationship with the control voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
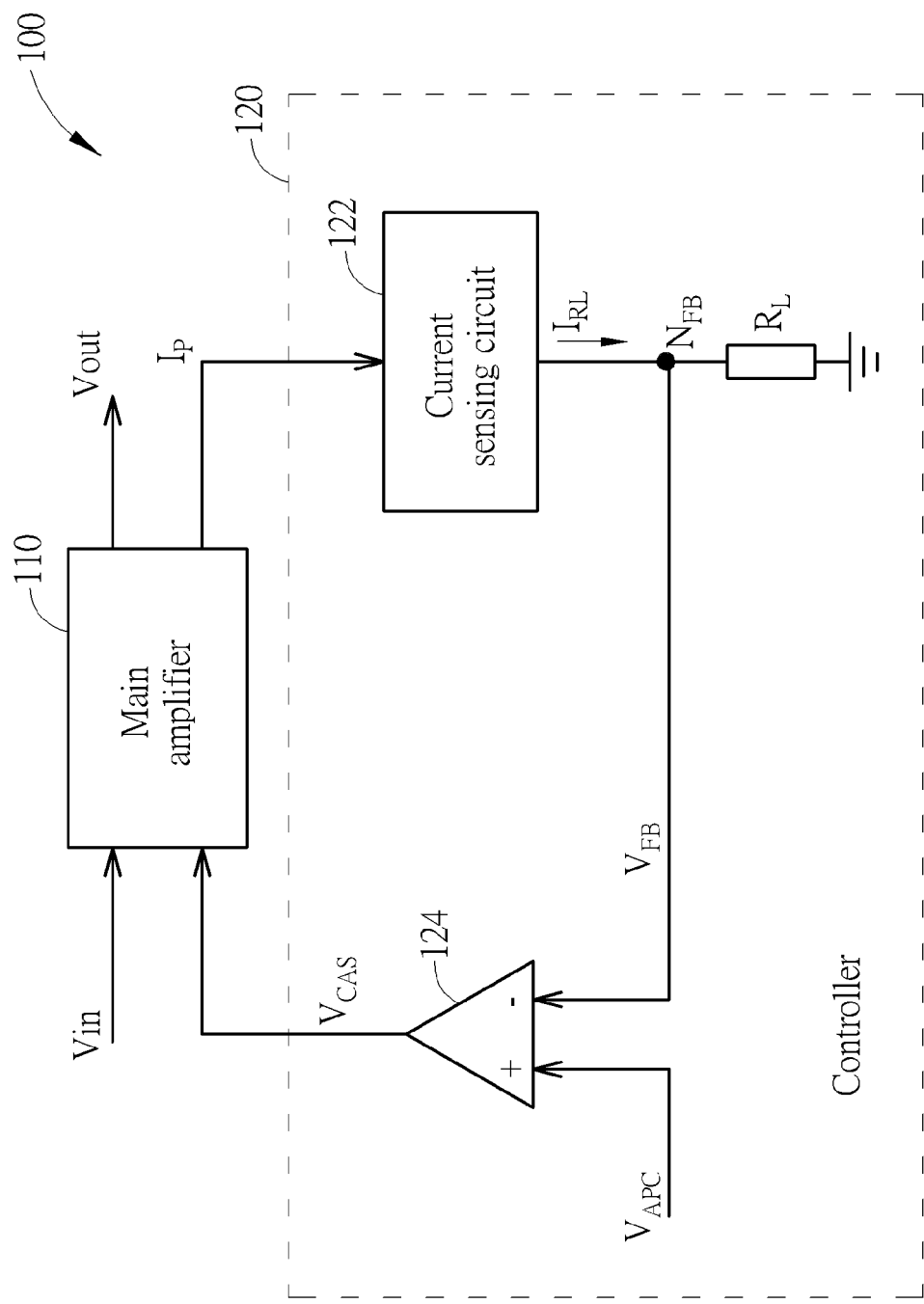
FIG. 1 is a diagram illustrating a variable gain amplifier circuit according to one embodiment of the present invention.

Please refer to FIG. 1, which is a diagram illustrating a variable gain amplifier circuit 100 according to one embodiment of the present invention. As shown in FIG. 1, the variable gain amplifier circuit 100 comprises a main amplifier 110 and a controller 120. The main amplifier 110 is configured to amplify an input signal Vin to generate an output signal Vout, and the controller 120 is configured to receive a control voltage $V_{APC}$ to generate an adjustment signal $V_{CAS}$ to control a gain of the main amplifier 110. In detail, the controller 120 comprises a current sensing circuit 122, a variable loading $R_L$ and a control amplifier 124, where the current sensing circuit 122 is configured to provide a sensed current $I_{RL}$ related to a current $I_P$ flowing through the main amplifier 110; the variable loading $R_L$ is coupled to the current sensing circuit 122 via a node $N_{FB}$, and the sensed current $I_{RL}$ flows through the node $N_{FB}$ and the variable loading $R_L$ to provide a loading voltage/feedback voltage $V_{FB}$ at the node $N_{FB}$; and the control amplifier 124 receives the control voltage $V_{APC}$ and the feedback voltage $V_{FB}$ of the node $N_{FB}$ to generate the adjustment signal $V_{CAS}$. In the loop of the main amplifier 110 and the controller 120 shown in FIG. 1, when the control voltage $V_{APC}$ changes, the related currents and the feedback voltage $V_{FB}$ also continuously changes until the feedback voltage $V_{FB}$ approximates the control voltage $V_{APC}$.

Figure 2:
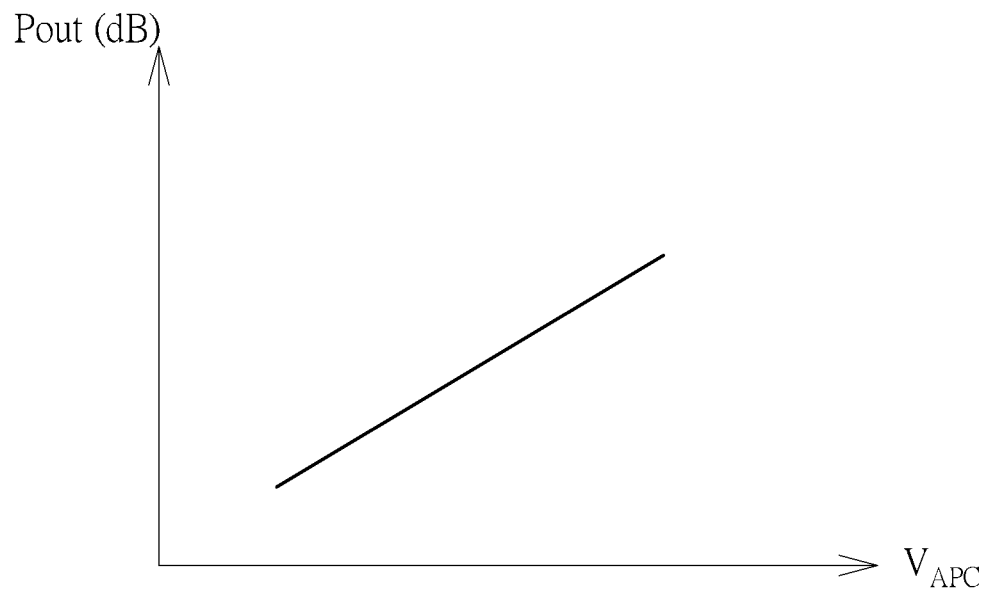
FIG. 2 shows the relationship between output power/output voltage and the control voltage, and the relationship between the current and the control voltage when the resistance of the variable loading has the exponential relation with the control voltage.
Figure 2:
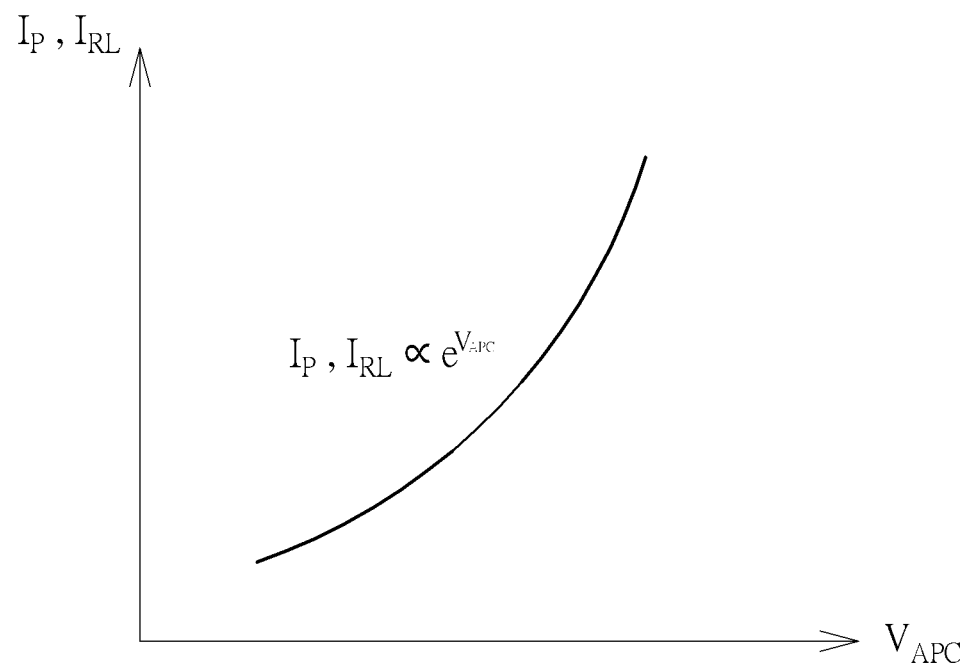

In FIG. 1, a resistance of the variable loading $R_L$ is determined based on the feedback voltage $V_{FB}$, and since the feedback voltage $V_{FB}$ approximates the control voltage $V_{APC}$, it is deemed that the resistance of the variable loading $R_L$ is controlled by the control voltage $V_{APC}$. In addition, in the loop shown in FIG. 1, when the resistance of the variable loading $R_L$ changes due to the change of the control voltage $V_{APC}$, the sensed current $I_{RL}$ and the current $I_P$ also change with the resistance of the variable loading $R_L$, that is, the gain of the main amplifier 110 changes with the control voltage $V_{APC}$. In this embodiment, the variable loading $R_L$ is designed to make the resistance have a nonlinear relation with the control voltage $V_{APC}$, wherein the nonlinear relation maybe an exponential relation or a polynomial relation such as a nonlinear decay the resistance of the variable loading $R_L$ has when the control voltage $V_{APC}$ increases. For example, FIG. 2 shows the relationship between output power Pout and the control voltage $V_{APC}$, and the relationship between the current $I_P$ or $I_{RL}$ and the control voltage $V_{APC}$ when the resistance of the variable loading $R_L$ has the exponential relation with the control voltage $V_{APC}$. As shown in FIG. 2, since the resistance of the variable loading $R_L$ has the exponential decay when the control voltage increases, the current $I_P/I_{RL}$ has the exponential increase with the control voltage $V_{APC}$. Therefore, the output power Pout has the linear-in-dB relation with the control voltage $V_{APC}$.

Figure 3:
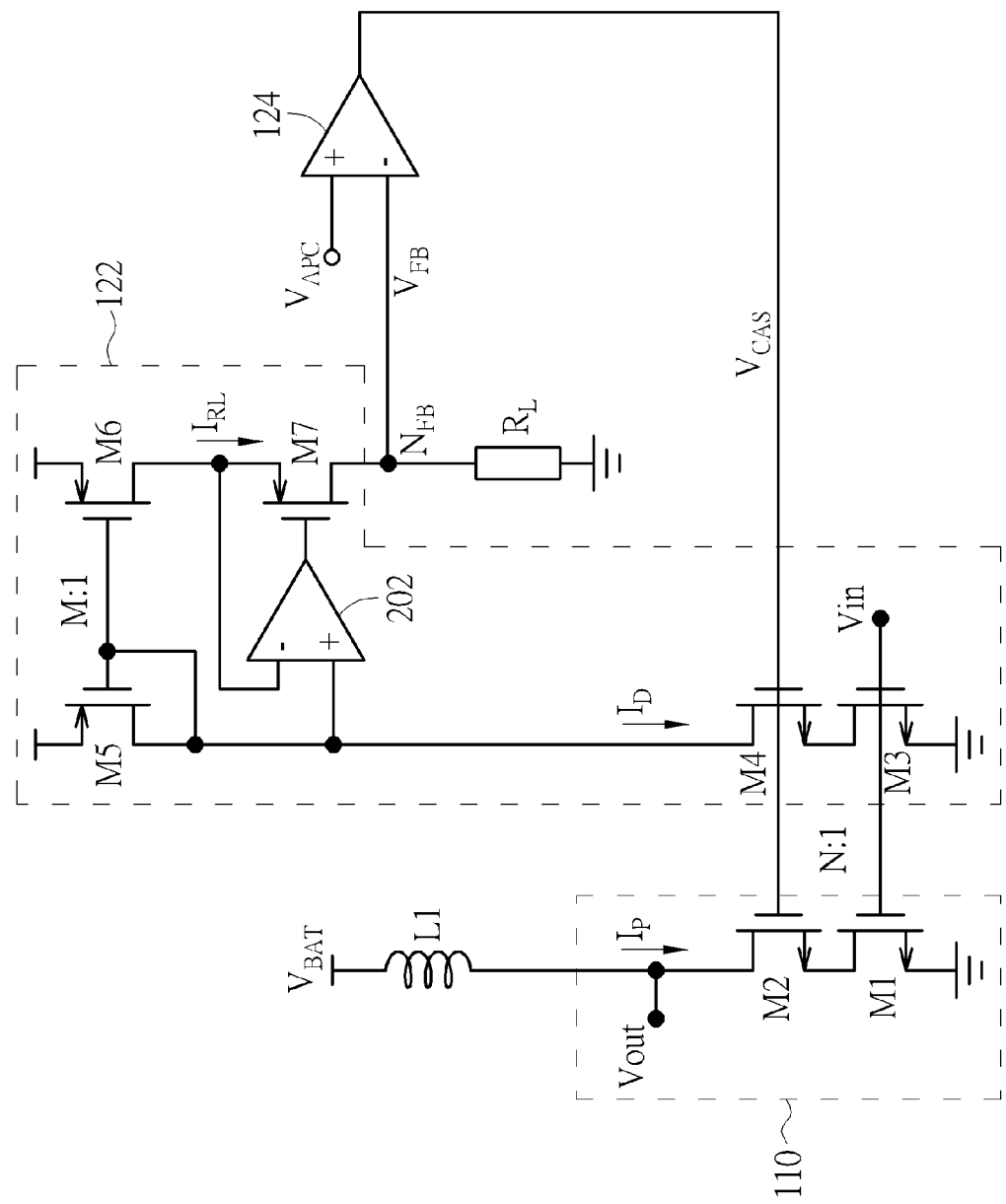
FIG. 3 is a diagram illustrating a detail structure of the variable gain amplifier circuit 100 according to one embodiment of the present invention.

Refer to FIG. 3, which is a diagram illustrating a detail structure of the variable gain amplifier circuit 100 according to one embodiment of the present invention. As shown in FIG. 3, the main amplifier 110 comprises two transistors M1 and M2, and is coupled to a supply voltage such as a battery voltage $V_{BAT}$ via an inductor L1; the current sensing circuit 122 comprises transistors M3-M7 and a control amplifier 202, and the current sensing circuit 122 is configured to provide a relationship between the current $I_P$ flowing through the main amplifier 110 and the sensed current $I_{RL}$. In one embodiment, the relationship between the current $I_P$ flowing through the main amplifier 110 and the sensed current $I_{RL}$ is a fixed relationship. In detail, the current sensing circuit 122 can be regarded as two current mirrors, that is, an intermediate current $I_D$ is a ratio (1/N) multiplying with the current $I_P$ flowing through the main amplifier 110 (i.e. $I_D=I_P/N$), and the sensed current $I_{RL}$ is a ratio (1/M) multiplying the intermediate current $I_D$ (i.e. $I_{RL}=I_D/M$), where N and M are any designed positive integers. It is noted that the main amplifier 110 and the current sensing circuit 122 shown in FIG. 3 are for illustrative purpose only, and are not limitations of the present invention.

Figure 4:
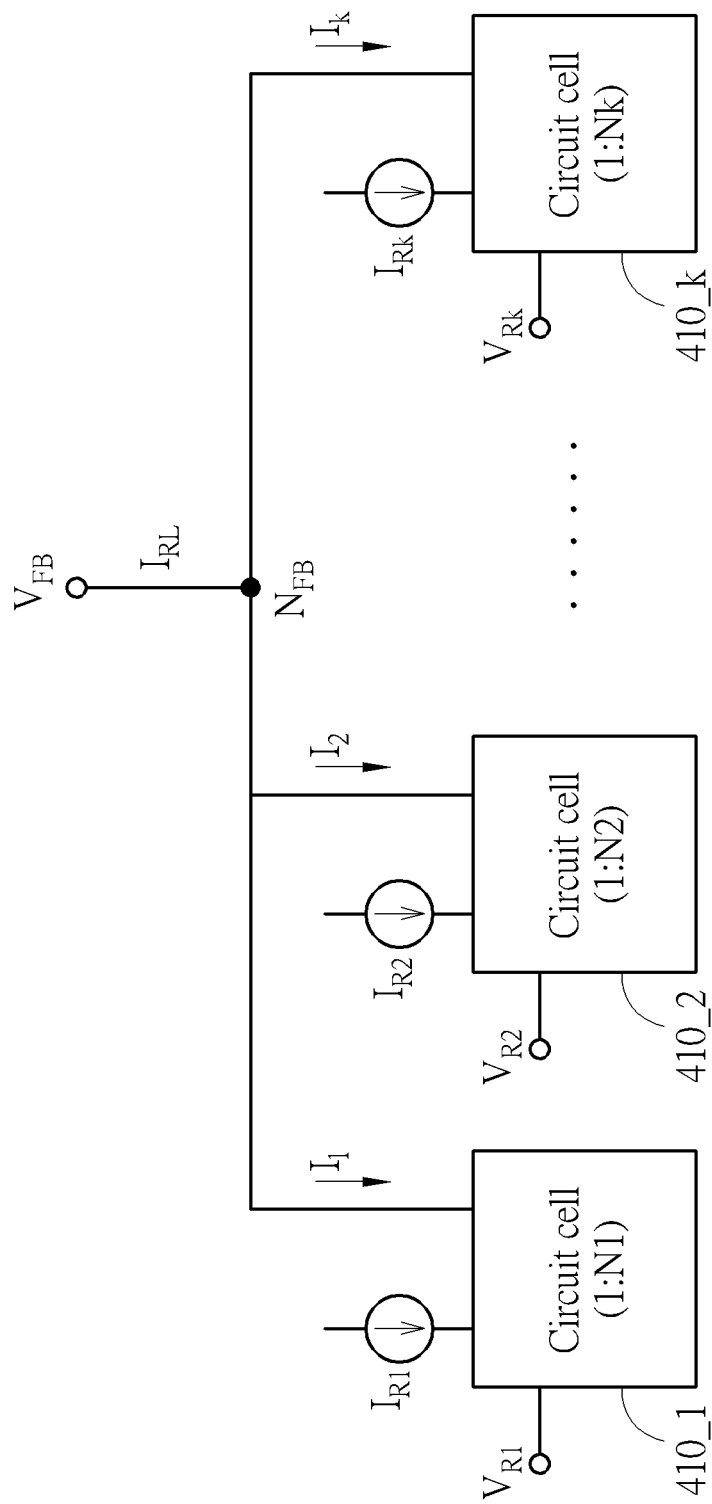
FIG. 4 is a diagram illustrating a detail structure of the variable loading according to one embodiment of the present invention.

Refer to FIG. 4, which is a diagram illustrating a detail structure of the variable loading $R_L$ according to one embodiment of the present invention. As shown in FIG. 4, the variable loading $R_L$ comprises k circuit cells 410_1-410_k, where k can be any positive integer equal to or greater than 2. The circuit cells 410_1-410_k receive reference voltages $V_{R1}$-$V_{Rk}$ and reference currents $I_{R1}$-$I_{Rk}$ and provide specific currents $I_1$-$I_k$ to the node $N_{FB}$, respectively. In FIG. 4, the values of the reference voltages $V_{R1}$-$V_{Rk}$ and the specific currents $I_1$-$I_k$ can be determined according to designer's consideration. For example, the reference voltages $V_{R1}$-$V_{Rk}$ may have different values, and the specific currents $I_1$-$I_k$ can have the same value, or the specific currents $I_1$-$I_k$ are not all the same. In one embodiment, for each of the circuit cells 410_1-410_k, the specific current $I_{(j)}$ is greater than the specific current $I_{(j-1)}$, and the reference voltages $V_{Rj}$ is greater than the reference voltage $V_{R(j-1)}$, where j can be any positive integer equal to or less than k.

Figure 5:
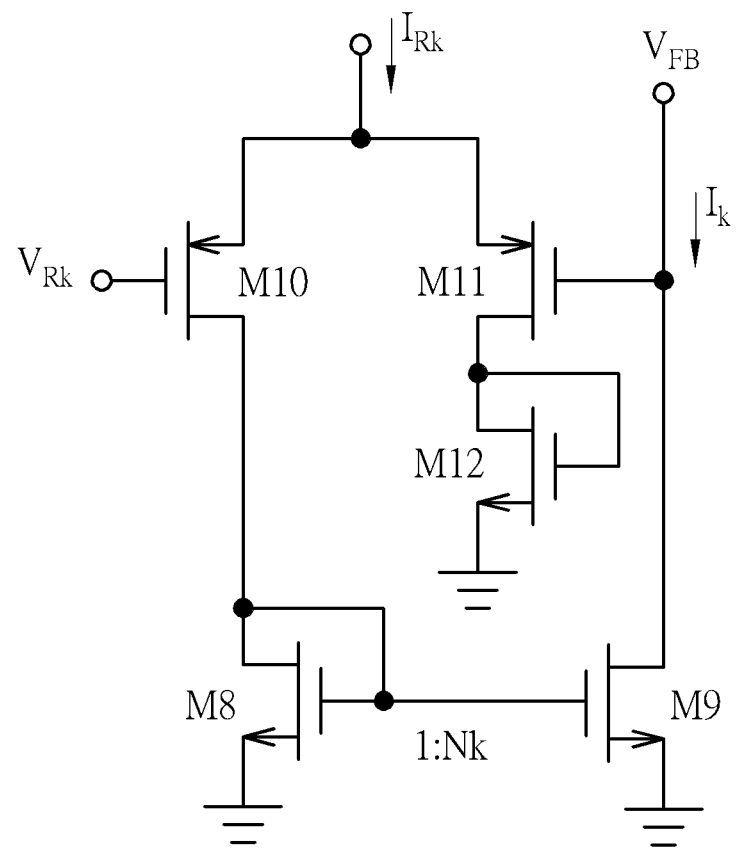
FIG. 5 shows a circuit structure of the circuit cell according to one embodiment of the present invention.
Figure 6:
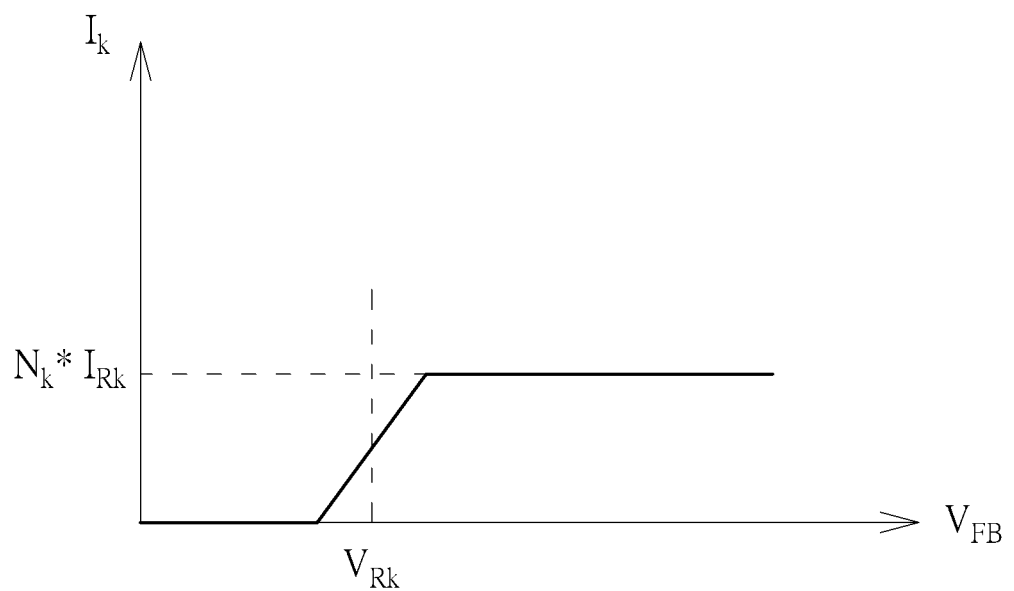
FIG. 6 shows the relationship between the specific current and the feedback voltage of the circuit cell shown in FIG. 5.

FIG. 5 shows a circuit structure of the circuit cell 410_k according to one embodiment of the present invention. As shown in FIG. 5, the circuit cell 410_k has transistors M8-M12, and when the feedback voltage $V_{FB}$ increases close to the reference voltage $V_{Rk}$, the transistor M11 starts to turnoff, and the reference current $I_{Rk}$ starts to flow through the transistors M10 and M8, and transistor M9 mirrors the current flowing through the transistor M8 with a ratio Nk to generate the specific current $I_k$. Finally, the specific current $I_k$ equals to $Nk*I_{Rk}$ as shown in FIG. 6.

Figure 7:
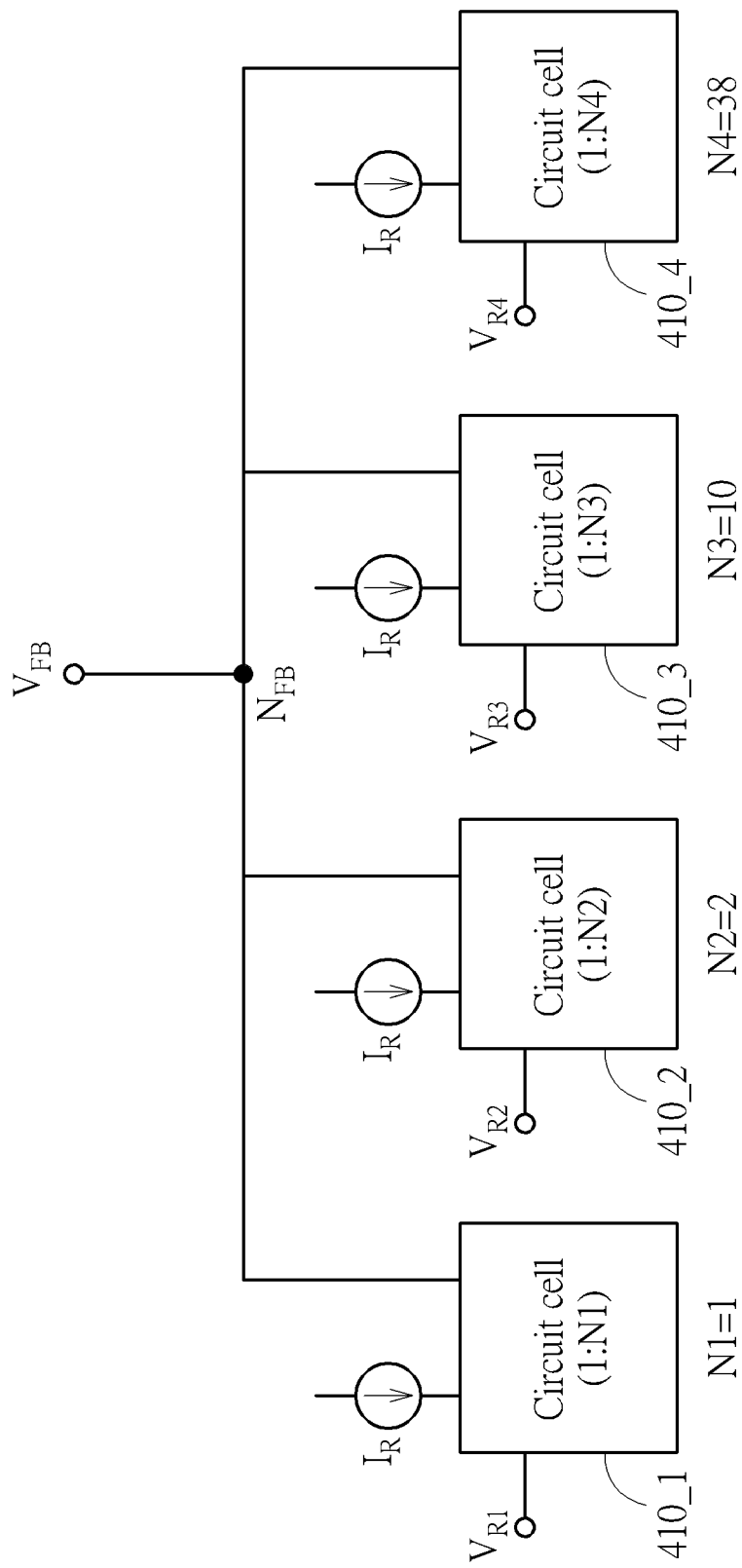
FIG. 7 is a diagram illustrating a detail structure of the variable loading when the quantity of the circuit cells shown in FIG. 4 is four.
Figure 8:
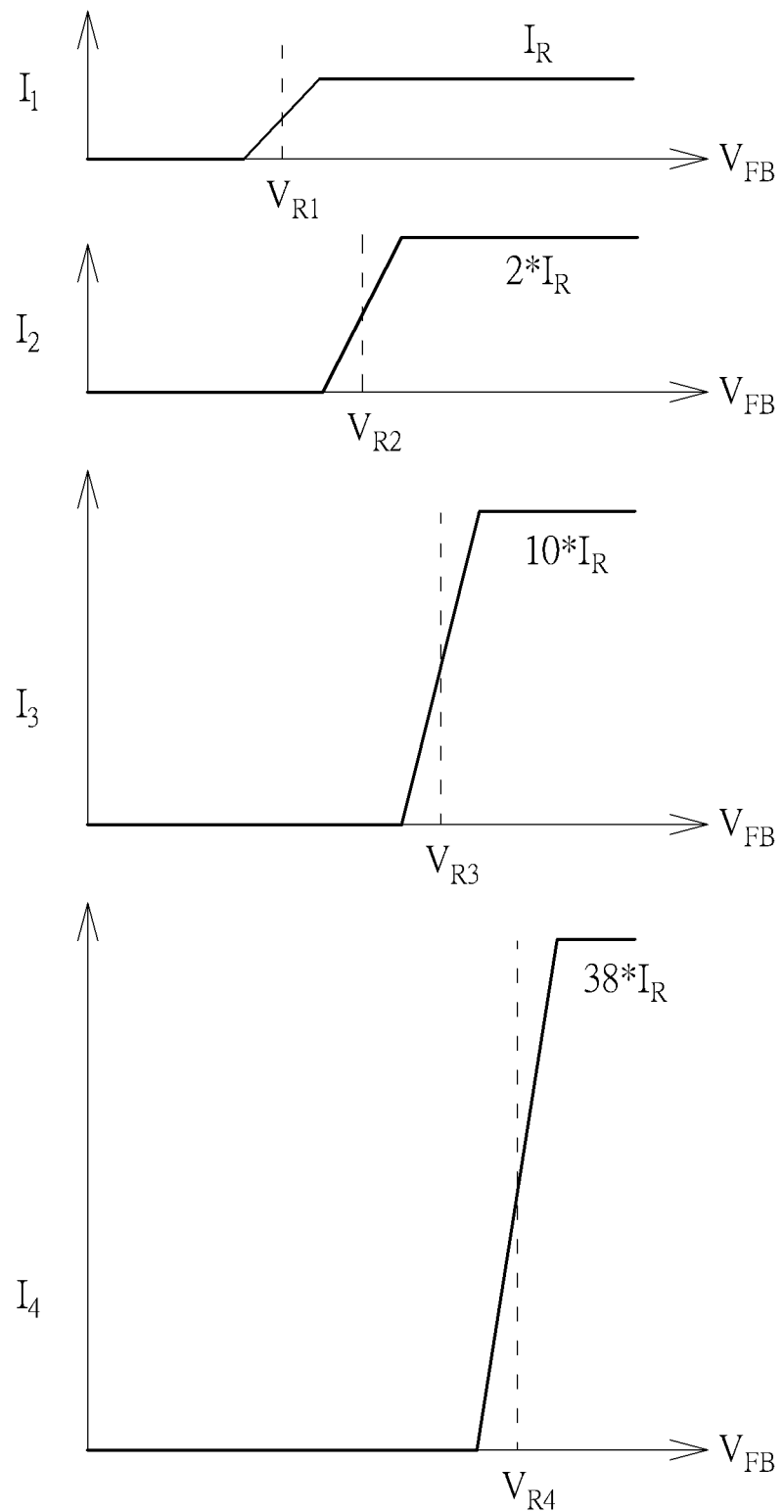
FIG. 8 shows the relationship between the specific currents and the feedback voltage.
Figure 9:
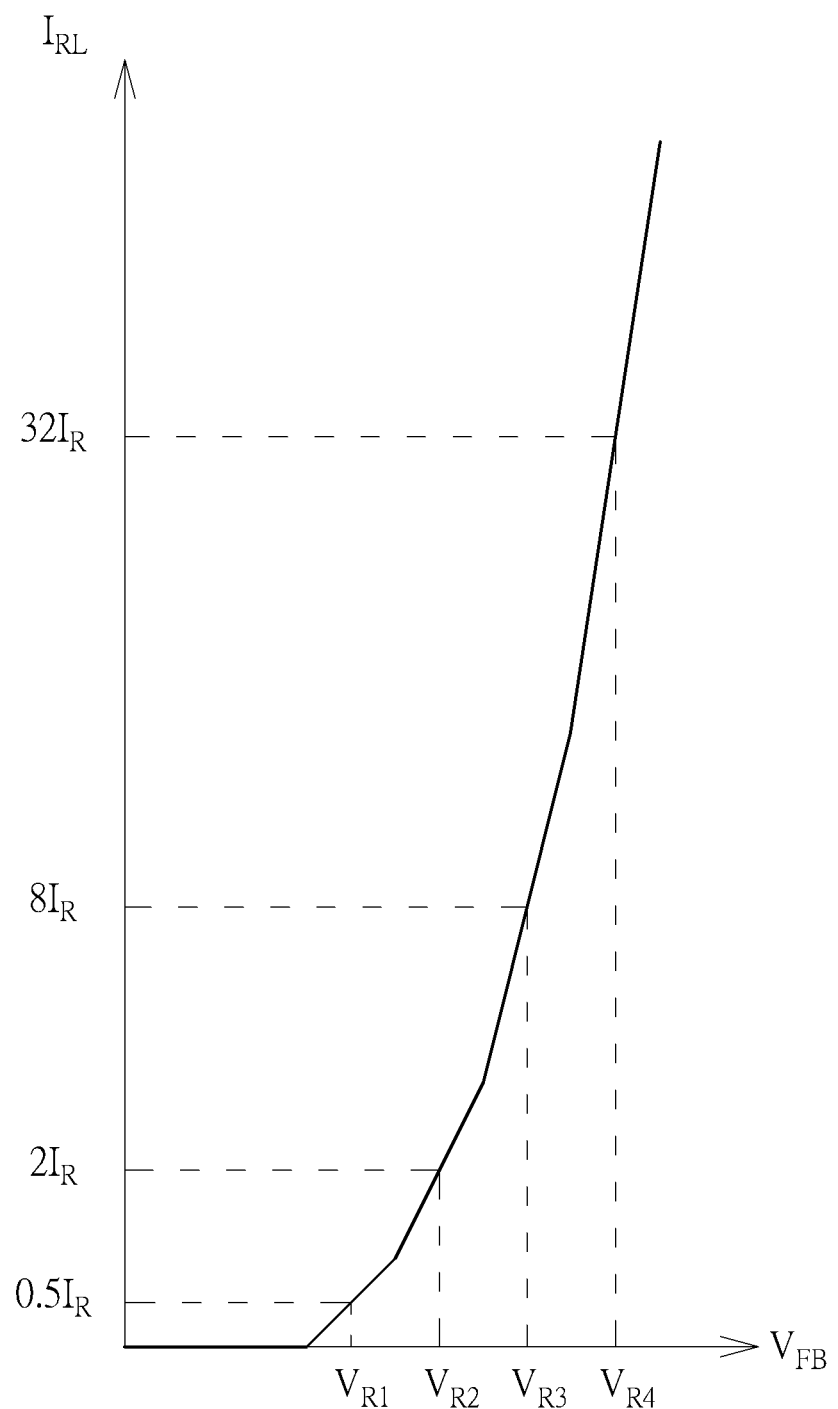
FIG. 9 shows the sensed current flowing through the node and the entire variable loading with the feedback voltage.

FIG. 7 is a diagram illustrating a detail structure of the variable loading $R_L$ when the quantity of the circuit cells shown in FIG. 4 is four, and each of the circuit cells is implemented by using the embodiment shown in FIG. 5. As shown in FIG. 7, the variable loading $R_L$ has four circuit cells 410_1-410_4, where the circuit cell 410_1 receives the reference voltage $V_{R1}$ and the reference current $I_R$, and the ratio N1 of the current mirror shown in FIG. 5 is "1"; the circuit cell 410_2 receives the reference voltage $V_{R2}$ and the reference current $I_R$, and the ratio N2 of the current mirror shown in FIG. 5 is "2"; the circuit cell 410_3 receives the reference voltage $V_{R3}$ and the reference current $I_R$, and the ratio N3 of the current mirror shown in FIG. 5 is "10"; the circuit cell 410_4 receives the reference voltage $V_{R4}$ and the reference current $I_R$, and the ratio N4 of the current mirror shown in FIG. 5 is "38". FIG. 8 shows the relationship between the specific currents $I_1$-$I_4$ and the feedback voltage $V_{FB}$, and FIG. 9 shows the sensed current $I_{RL}$ flowing through the node $N_{FB}$ and the entire variable loading $R_L$ with the feedback voltage $V_{FB}$, where the sensed current $I_{RL}$ is the summation of all the specific currents provided by the circuit cells 410_1-410_4. As shown in FIGS. 7-9, the variable loading $R_L$ can operate to make the sensed current $I_{RL}$ has the exponential relation with the feedback voltage $V_{FB}$, that is the output power of the main amplifier 110 also has the exponential relation (linear-in-dB) with the control voltage $V_{APC}$ ($V_{FB} \sim V_{APC}$).

In one embodiment, to make the operations of the controller 120 be independent from the temperature/process variations, the reference voltages $V_{R1}$-$V_{Rk}$ shown in FIG. 4 can be generated by bandgap reference voltage generators, and the reference currents $I_{R1}$-$I_{Rk}$ can be generated by bandgap reference current generators.

It is noted that the embodiment of the variable loading $R_L$ shown in FIG. 4 and the circuit cell shown in FIG. 5 are for illustrative purposes only, and are not limitations of the present invention. In other embodiments of the present invention, the circuit cells shown in FIG. 4 may have different circuit designs, and the variable loading $R_L$ may further comprise a resistor connected in parallel with the circuit cells 410_1-410_k. These alternative designs shall fall within the scope of the present invention.

Figure 10:
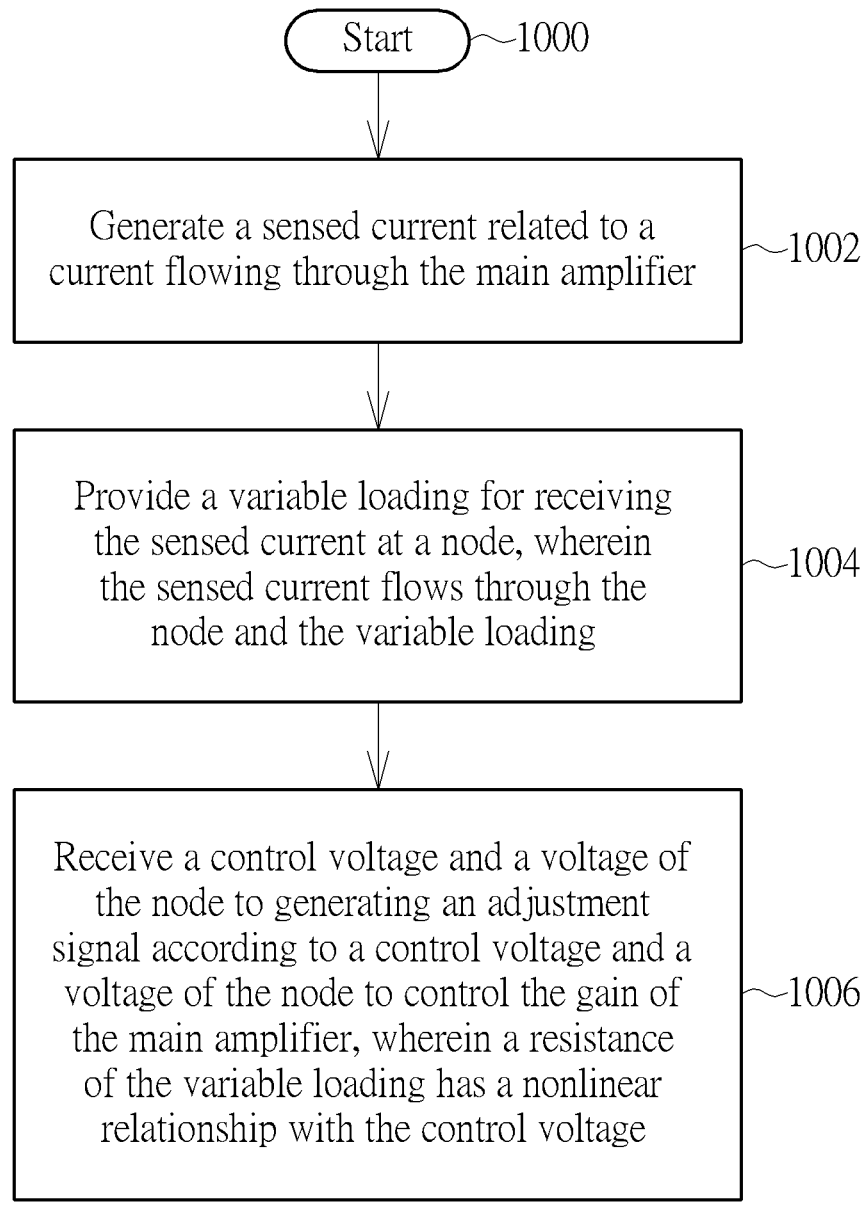
FIG. 10 is a flowchart of a method for controlling a main amplifier according to one embodiment of the present invention.

Please refer to FIG. 1 and FIG. 10 together, FIG. 10 is a flowchart of a method for controlling a main amplifier according to one embodiment of the present invention. As shown in FIG. 10, the flow is described as follows.

Step 1000: the flow starts.

Step 1002: generate a sensed current related to a current flowing through the main amplifier.

Step 1004: provide a variable loading for receiving the sensed current at a node, wherein the sensed current flows through the node and the variable loading.

Step 1006: receive a control voltage and a voltage of the node to generating an adjustment signal according to a control voltage and a voltage of the node to control the gain of the main amplifier, wherein a resistance of the variable loading has a nonlinear relationship with the control voltage.

Briefly summarized, in the variable gain amplifier circuit, controller of a main amplifier and associated control method of the present invention, by using the variable loading whose resistance has a nonlinear relation (e.g. exponential relation) with the control voltage, the main amplifier can have the desired output power in response to the control voltage (e.g. linear-in-dB relationship). Therefore, the embodiments of the present invention can provide an accurate and predictable output power. In addition, by setting the reference voltages, reference currents and/or ratios of the current mirrors shown in FIGS. 4-5, the output power of the main amplifier and the control voltage may have different relationship, that is the embodiments of the present invention is flexibility for the specification(s), and is tunable for amplifier characteristics.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A variable gain amplifier circuit, comprising:
   a main amplifier, for amplifying an input signal to generate an output signal;
   a current sensing circuit, coupled to the main amplifier, for providing a sensed current related to a current flowing through the main amplifier;
   a variable loading, coupled to the current sensing circuit via a node, wherein the sensed current flows through the node and the variable loading to provide a loading voltage; and
   a control amplifier, coupled to the node and the main amplifier, for receiving a control voltage and the loading voltage to generate an adjustment signal to control a gain of the main amplifier;
   wherein a resistance of the variable loading has a nonlinear relationship with the control voltage; and the variable loading comprises a plurality of circuit cells, and each of the circuit cells provides a specific current to the node, and a combination of the specific currents provided by the circuit cells is comprised of the sensed current flowing through the node and the variable loading.

2. The variable gain amplifier circuit of claim 1, wherein the resistance of the variable loading has an exponential relationship with the control voltage.

3. The variable gain amplifier circuit of claim 1, wherein the resistance of the variable loading has a polynomial relationship with the control voltage.

4. The variable gain amplifier circuit of claim 1, wherein a summation of the specific currents provided by the circuit cells is the sensed current flowing through the node and the variable loading.

5. The variable gain amplifier circuit of claim 4, wherein the specific currents provided by the circuit cells are the same.

6. The variable gain amplifier circuit of claim 4, wherein the circuit cells receives a plurality of reference voltages, respectively, and each circuit cell provides the specific current to the node when a specific voltage is greater than the received reference voltage, wherein the specific voltage is generated according to the control voltage inputted into the control amplifier.

7. The variable gain amplifier circuit of claim 6, wherein the plurality of reference voltages are not all the same.

8. The variable gain amplifier circuit of claim 7, wherein for the circuit cells, the smaller the received reference voltage, the larger the specific current provided to the node.

9. A controller of a main amplifier, comprising:
   a current sensing circuit, for generating a sensed current related to a current flowing through the main amplifier;
   a variable loading, coupled to the current mirror via a node, wherein the sensed current flows through the node and the variable loading; and
   a control amplifier, coupled to the node, for receiving a control voltage and a loading voltage of the node to generate an adjustment signal to control a gain of the main amplifier;
   wherein a resistance of the variable loading has a nonlinear relationship with the control voltage; and the variable loading comprises a plurality of circuit cells, and each of the circuit cells provides a specific current to the node, and a combination of the specific currents provided by the circuit cells is comprised of the sensed current flowing through the node and the variable loading.

10. The controller of claim 9, wherein the resistance of the variable loading has an exponential relationship with the control voltage.

11. The controller of claim 9, wherein the resistance of the variable loading has a polynomial relationship with the control voltage.

12. The controller of claim 9, wherein a summation of the specific currents provided by the circuit cells is the sensed current flowing through the node and the variable loading.

13. The controller of claim 12, wherein the specific currents provided by the circuit cells are the same.

14. The controller of claim 12, wherein the circuit cells receives a plurality of reference voltages, respectively, and each circuit cell provides the specific current to the node when a specific voltage is greater than the received reference voltage, wherein the specific voltage is generated according to the control voltage inputted into the control amplifier.

15. The controller of claim 14, wherein the plurality of reference voltages are not all the same.

16. The controller of claim 15, wherein for the circuit cells, the smaller the received reference voltage, the larger the specific current provided to the node.

17. A method for controlling a main amplifier, comprising:
   generating a sensed current related to a current flowing through the main amplifier;
   providing a variable loading for receiving the sensed current at a node, wherein the variable loading comprises a plurality of circuit cells, and each of the circuit cells provides a specific current to the node, and a combination of the specific currents provided by the circuit cells is comprised of the sensed current flowing through the node and the variable loading; and generating an adjustment signal according to a control voltage and a loading voltage of the node to control a gain of the main amplifier;

wherein a resistance of the variable loading has a non-linear relationship with the control voltage.

18. The method of claim 17, wherein the resistance of the variable loading has an exponential relationship with the control voltage.

19. The method of claim 17, wherein the resistance of the variable loading has a polynomial relationship with the control voltage.

20. The variable gain amplifier of claim 1, wherein each of the circuit cells comprises:
 a first N-type transistor;
 a second N-type transistor, wherein a gate electrode of the second N-type transistor is coupled to a gate electrode of the first N-type transistor;
 a first P-type transistor, wherein a gate electrode of the first P-type transistor is coupled to a reference voltage, and a drain electrode of the first P-type transistor is coupled to a drain electrode of the first N-type transistor;
 a second P-type transistor, wherein a gate electrode of the second P-type transistor is coupled to a drain electrode of the second N-type transistor, and a source electrode of the first P-type transistor and a source electrode of the second P-type transistor are coupled to a terminal supplied by a reference current; and
 a third N-type transistor, wherein a gate electrode and a drain electrode of the third N-type transistor is coupled to a drain electrode of the second P-type transistor;
 wherein a current flows through the second N-type transistor serves as the specific current of the circuit cell.

21. The controller of claim 9, wherein each of the circuit cells comprises:
 a first N-type transistor;
 a second N-type transistor, wherein a gate electrode of the second N-type transistor is coupled to a gate electrode of the first N-type transistor;
 a first P-type transistor, wherein a gate electrode of the first P-type transistor is coupled to a reference voltage, and a drain electrode of the first P-type transistor is coupled to a drain electrode of the first N-type transistor;
 a second P-type transistor, wherein a gate electrode of the second P-type transistor is coupled to a drain electrode of the second N-type transistor, and a source electrode of the first P-type transistor and a source electrode of the second P-type transistor are coupled to a terminal supplied by a reference current; and
 a third N-type transistor, wherein a gate electrode and a drain electrode of the third N-type transistor is coupled to a drain electrode of the second P-type transistor;
 wherein a current flows through the second N-type transistor serves as the specific current of the circuit cell.

22. The method of claim 17, wherein each of the circuit cells comprises:
 a first N-type transistor;
 a second N-type transistor, wherein a gate electrode of the second N-type transistor is coupled to a gate electrode of the first N-type transistor;
 a first P-type transistor, wherein a gate electrode of the first P-type transistor is coupled to a reference voltage, and a drain electrode of the first P-type transistor is coupled to a drain electrode of the first N-type transistor;
 a second P-type transistor, wherein a gate electrode of the second P-type transistor is coupled to a drain electrode of the second N-type transistor, and a source electrode of the first P-type transistor and a source electrode of the second P-type transistor are coupled to a terminal supplied by a reference current; and
 a third N-type transistor, wherein a gate electrode and a drain electrode of the third N-type transistor is coupled to a drain electrode of the second P-type transistor;
 wherein a current flows through the second N-type transistor serves as the specific current of the circuit cell.

* * * * *